United States Patent
Steinmann et al.

(10) Patent No.: US 7,498,639 B2
(45) Date of Patent: Mar. 3, 2009

(54) INTEGRATED BiCMOS SEMICONDUCTOR CIRCUIT

(75) Inventors: Philipp Steinmann, Unterschleissheim (DE); Scott Balster, Dallas, TX (US); Badih El-Kareh, Cedar Park, TX (US); Thomas Scharnagl, Tiefenbach (DE); Michael Schmitt, Haag a.d. Amper (DE)

(73) Assignee: Texas Instruments Incorporated, Dallas, TX (US)

( * ) Notice: Subject to any disclaimer, the term of this patent is extended or adjusted under 35 U.S.C. 154(b) by 344 days.

(21) Appl. No.: 11/233,960

(22) Filed: Sep. 23, 2005

(65) Prior Publication Data

US 2006/0073672 A1  Apr. 6, 2006

(30) Foreign Application Priority Data

Sep. 23, 2004  (DE) ........................ 10 2004 046 174

(51) Int. Cl.
*H01L 31/112* (2006.01)
(52) U.S. Cl. ................ 257/370; 257/374; 257/E21.434; 438/445
(58) Field of Classification Search ................ 438/444, 438/445, 446; 257/506, 737, 370, 518, 378, 257/517, 588
See application file for complete search history.

(56) References Cited

U.S. PATENT DOCUMENTS

| | | | | |
|---|---|---|---|---|
| 5,326,726 | A | * 7/1994 | Tsang et al. | ................... 438/52 |
| 6,004,829 | A | 12/1999 | Chang et al. | |
| 6,214,699 | B1 | * 4/2001 | Joyner | ........................ 438/445 |

* cited by examiner

*Primary Examiner*—Andy Huynh
*Assistant Examiner*—Thinh T Nguyen
(74) *Attorney, Agent, or Firm*—Frederick J. Telecky, Jr.; Wade J. Brady, III

(57) ABSTRACT

An integrated BiCMOS semiconductor circuit has active moat areas in silicon. The active moat areas include electrically active components of the semiconductor circuit, which comprise active window structures for base and/or emitter windows. The integrated BiCMOS semiconductor circuit has zones where silicon is left to form dummy moat areas which do not include electrically active components, and has isolation trenches to separate the active moat areas from each other and from the dummy moat areas. The dummy moat areas comprise dummy window structures having geometrical dimensions and shapes similar to those of the active window structures for the base and/or emitter windows.

4 Claims, 5 Drawing Sheets

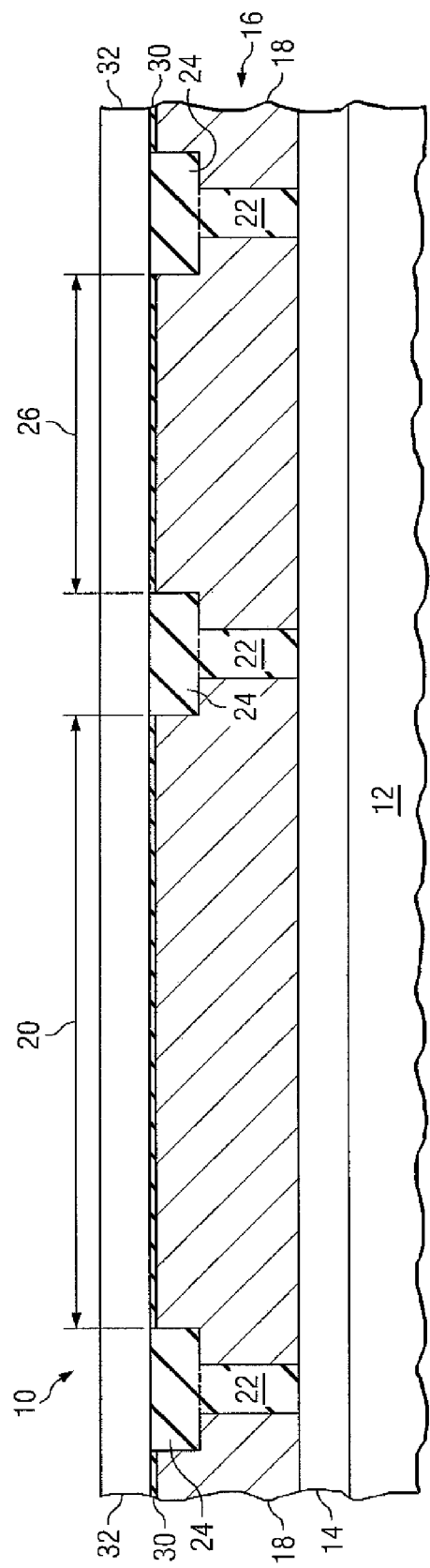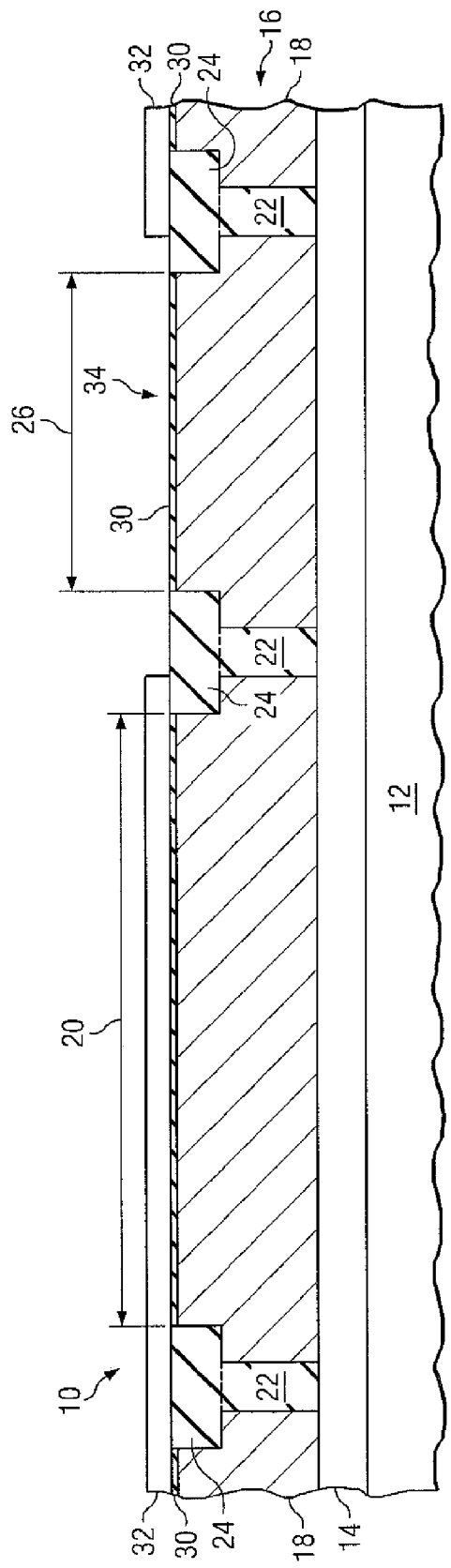

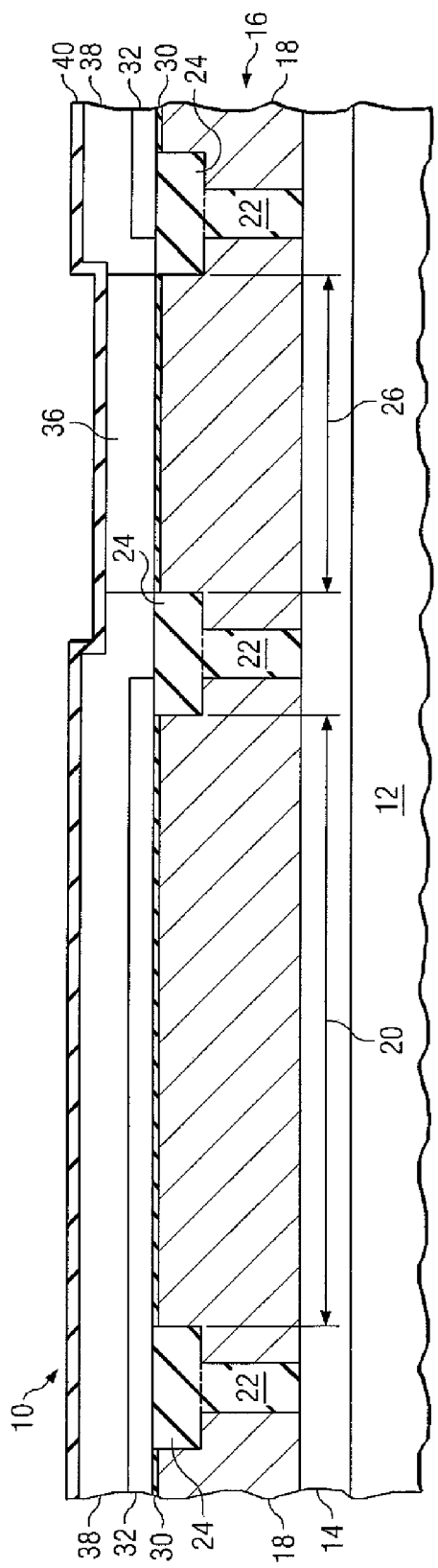
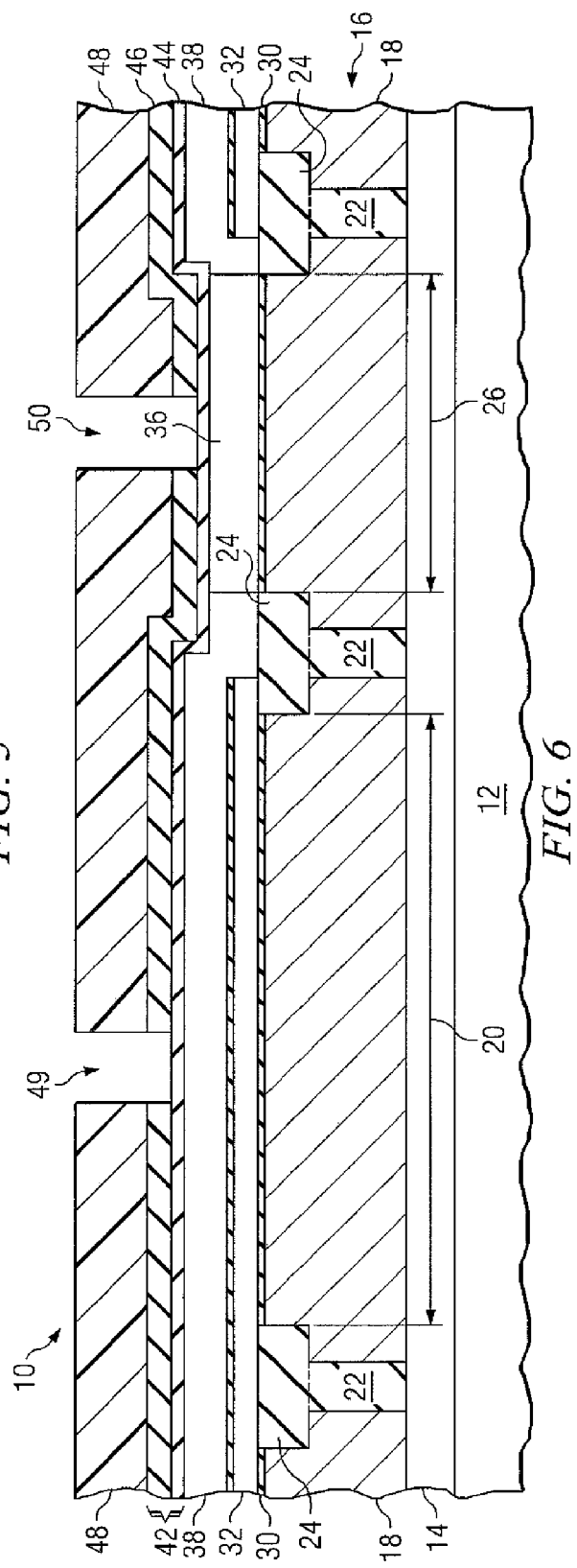

INTEGRATED BICMOS SEMICONDUCTOR CIRCUIT

The invention relates to integrated BiCMOS semiconductor circuits having active moat areas in silicon.

BACKGROUND

There are integrated BiCMOS semiconductor circuits that have active moat areas in silicon. These moat areas include electrically active components of the semiconductor circuit, the active components comprising active window structures for base and/or emitter windows. The semiconductor circuit has zones where silicon is left to form dummy moat areas which do not include electrically active components. The semiconductor circuit further has isolation trenches to separate the active moat areas from each other and from the dummy moat areas.

In the production of integrated BiCMOS semiconductor circuits, a plurality of silicon and oxide layers are deposited on a support wafer and patterned in consecutive steps. An example of such a stack of layers is shown in a schematic sectional view in FIG. 1 of the appending drawings. Upon patterning, stacks of layers, generally referred to as 1 in FIG. 1, form so called active moat areas 2. These areas are islands which will in the end contain electrically active components of the semiconductor circuit. The active moat areas 2 are separated by trenches 3 formed into the layers by etching. The trenches are filled with an isolating material 4 such as oxide. Above a trench 3, a shallow depression 3a may form in the oxide layer 4. Depending on the layout of the circuit, the distance between two adjacent active moat areas 2 can be wide, resulting in a broad trench 5. Where the trenches are too wide, deep depressions 6 in the oxide layer 4 will occur.

These deep depressions 6 become a problem when performing a process of chemical mechanical polishing (CMP) on a layer.

To avoid the occurrence of depressions in the oxide layer 4, so called dummy moat areas 7 are left (FIG. 2). These areas 7 are islands which are designed not to include electrically active components but simply to avoid large and deep depressions. Incidentally, the technique of leaving dummy moat areas 7 is known in the prior art to ensure correct planarization.

Anisotropic plasma etching is used for the etching of fine structures. The etching duration may be pre-determined, but if the underlying layer is thin, e.g., a thin oxide film, it is essential to stop the etching in time before the underlying silicon gets damaged, but not before the desired structure is completed. This is particularly essential when dealing with small structures. Due to inaccuracies in the thickness of the layer to be etched and in the etchant composition, the calculation of the etching duration cannot be exact. Still, the completion of the etching process can be controlled more accurately by detecting an endpoint in the process. As explained in the article entitled, "Tungsten silicide and tungsten polycide anisotropic dry etch process for highly controlled dimensions and profiles," by R. Bashir, et al., in J. Vac. Sci. Technol., Vol. 16(4), July/August 1998, pages 2118-2120, and in U.S. Pat. No. 6,444,542B2, the endpoint of the etching process can be detected by a change in the composition of the optical radiation by optical emission spectroscopy, by the plasma characteristics, i.e., high-frequency harmonics, or the discharge current, or by a change in reflection properties of the wafer when the etching process reaches the underlying layer. Reaching an oxide layer can also be used as an endpoint check (U.S. Pat. No. 5,496,764A). But, if the surface to be etched is very small compared to the total wafer surface, detection of the endpoint of the etching process with this approach is no longer possible.

In U. S. Pat. No. 6,004,829A, it is proposed to enlarge the surface to be etched by inserting additional pad areas in forming an EPROM device. It is, however, well-known that large areas exhibit a higher etch-rate than small structures. If now the window structures to be etched are very small and delicate, and dummy surfaces are used for etch endpoint detection, the etch endpoint signal will occur prematurely, so that the optimum moment in time when the etching process should be terminated cannot be determined with sufficient precision.

SUMMARY

The invention provides an integrated BiCMOS semiconductor with accurately etched very small geometries.

Specifically, an integrated BiCMOS semiconductor circuit having active moat areas in silicon is provided. The active moat areas include electrically active components of the semiconductor circuit. The active components comprise active window structures for base and/or emitter windows. The circuit further has zones where silicon is left to form dummy moat areas which do not include electrically active components, and isolation trenches to separate the active moat areas from each other and from the dummy moat areas. The dummy moat areas comprise dummy window structures having geometrical dimensions and shapes similar to those of the active window structures for the base and/or emitter windows.

In the production process of this integrated BiCMOS circuit, the active window structures for base and/or emitter windows in the active moat areas and the dummy window structures within the dummy moat areas having similar geometrical dimensions and shapes are formed simultaneously. The total surface area of the window structures which are exposed to the etchant is importantly in-creased by having both active and dummy window structures. Hence, a signal for the endpoint detection can be detected much more clearly than in a case where only small active window structures are etched. Since the dummy window structures are of similar geometrical shape and dimension as the active window structures, the signal for the detection of the etching endpoint for the small structures is distinct and not blurred by the effect of a different etching characteristic as it would be, if coarse or large dummy structures were used. So the optimum moment in time when the etching process shall be terminated is precisely determined by the endpoint signal. The integrated circuit according to the invention can be manufactured with high precision, avoiding over etching and large under-cutting which would otherwise result in an increase in emitter-base leakage, an enlarged emitter size and in the end cause a large variability in bipolar parameters. The proposed integrated circuit provides for reliable etch endpoint detection of very small structures independent of structure size.

The total surface of the dummy window structures should preferably exceed that of the real window structures by at least one order of magnitude, thereby to increase the precision of the determination of the completion point of the etching process.

In an embodiment of the invention, the dummy window structures in those layers in which active base windows are formed in the active moat areas and the dummy structures in those layers in which active emitter windows are formed in the active moat areas, are stacked within the dummy moat areas. This provides for a very economic use of moat area.

The reliable etch endpoint detection scheme can be extended to a checkerboard pattern to allow a total of four sequential end-pointed etch processes, namely emitter and base openings for NPN and PNP, without requiring additional moat area.

BRIEF DESCRIPTION OF THE DRAWINGS

Example embodiments of the invention are described, with reference to the accompanying drawings, wherein:

FIGS. 3-6 are schematic sectional views through an integrated semiconductor circuit according to the invention, in successive steps of a production process.

DETAILED DESCRIPTION

Figure 1:
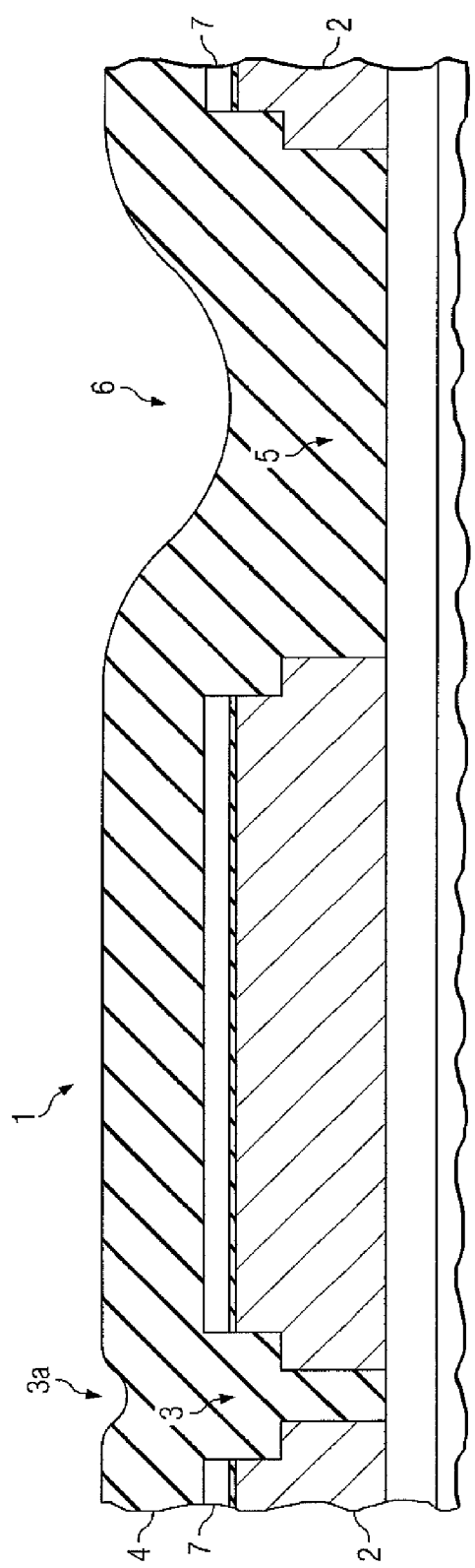
FIG. 1 is a schematic sectional view through a first integrated semiconductor circuit from the state of the art.
Figure 2:
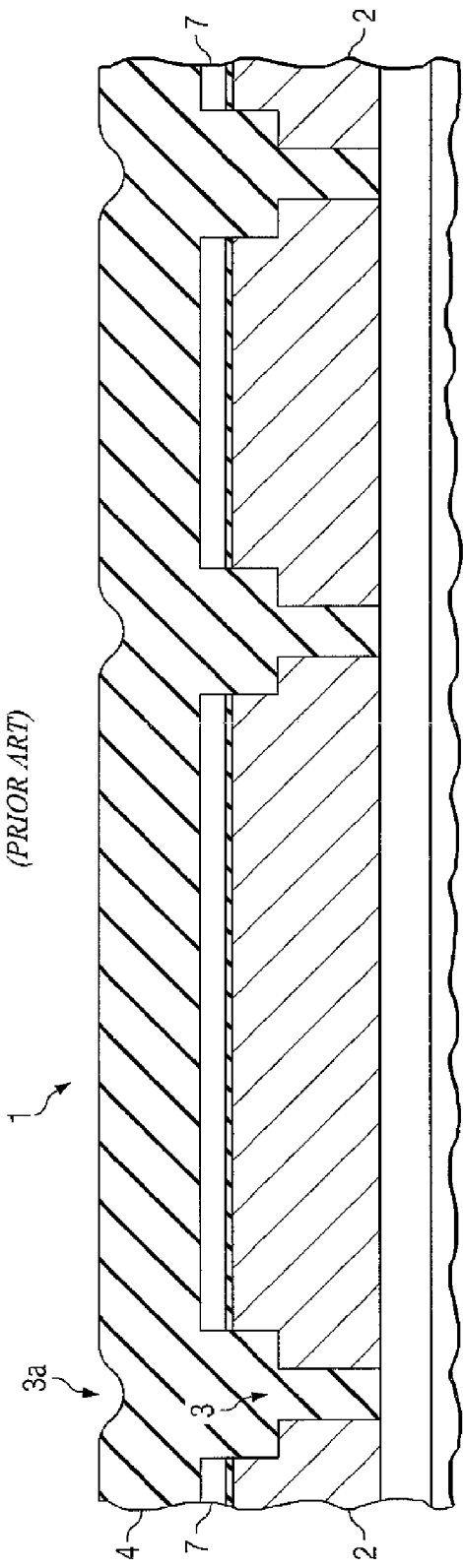
FIG. 2 is a schematic sectional view through a second integrated semiconductor circuit from the state of the art.

FIGS. 3-6 illustrate an integrated BiCMOS semiconductor circuit 10 according to the invention in a photolithographic production process.

In FIG. 3, the integrated semiconductor circuit 10 is shown in a cross-sectional view. The integrated semiconductor circuit 10 is at an intermediate process stage and has already undergone several process steps which are known to those skilled in the art, further description of which is not needed for understanding the invention.

In the illustrated process stage, the integrated semiconductor circuit 10 comprises a support wafer 12 covered by a buried oxide layer (BOX) 14. The BOX 14 supports a single-crystal silicon layer 16. The silicon layer 16 is divided into islands 18, forming active moat areas 20, which will in the end contain electrically active components (not shown in the figures) of the semiconductor circuit. The islands 18 are separated by deep trenches 22 and shallow trenches 24, filled with oxide to isolate the active moat areas 20 from each other. Further islands are remaining, forming dummy moat areas 26 to ensure correct planarization in a process of chemical mechanical polishing (CMP). On top of the active moat areas 20 and the dummy moat areas 26, a thin gate oxide film 30 is grown and then covered by a thin polysilicon layer 32. The thin polysilicon layer 32 comprises the first part of CMOS polysilicon gates on the chip.

The creation of dummy structures in the dummy moat area 26 is explained below.

In FIG. 4, the polysilicon layer 32 is patterned and etched to provide base window structures (not shown) in the active moat areas 20. The etching must be complete and must be stopped immediately when the gate oxide 30 is reached. Therefore, according to the principles of the invention, dummy base window structures 34 are created in the dummy moat areas 26 simultaneously with the active base window structures in the active moat areas 20. These dummy base window structures 34 have geometrical dimensions and shapes that are similar to those of the active base window structures in the active moat areas 20.

After the base window structure patterning, the residual thin oxide film 30 is removed within the active base window structures and the dummy base window structures 34 (FIG. 5), e.g., by wet etching. Then a base silicon/polysilicon layer is deposited. This deposit grows as a single-crystal silicon layer 36 over the exposed single-crystal silicon 16 in the active base window structures of the active moat areas 20 and in the dummy base window structures 34 of the dummy moat areas 26, while it grows as a polycrystaline silicon layer 38 over the remaining polysilicon layer 32 and the exposed shallow trenches 24. The silicon layers 36, 38 are then covered with a screen oxide 40 in preparation for implantation and the next patterning step.

The screen oxide 40 is removed and an inter-poly insulator stack 42 deposited (FIG. 6). The inter-poly insulator stack 42 comprises a thin oxide film 44, covered by a nitride film 46. Then a photoresist layer 48 is applied and patterned to create active emitter window structures 49 in the inter-poly insulator stack 42. Again, it is important to detect the endpoint for this step, because a defined thickness of the oxide film 44 must remain in the active emitter window structures. Therefore, according to the principles of the invention, dummy emitter window structures 50 are created in the dummy moat areas 26 simultaneously with the active emitter window structures in the active moat areas 20. Again, these dummy emitter window structures 50 have geometrical dimensions and shapes that are similar to those of the active emitter window structures in the active moat areas 20.

Figure 7:
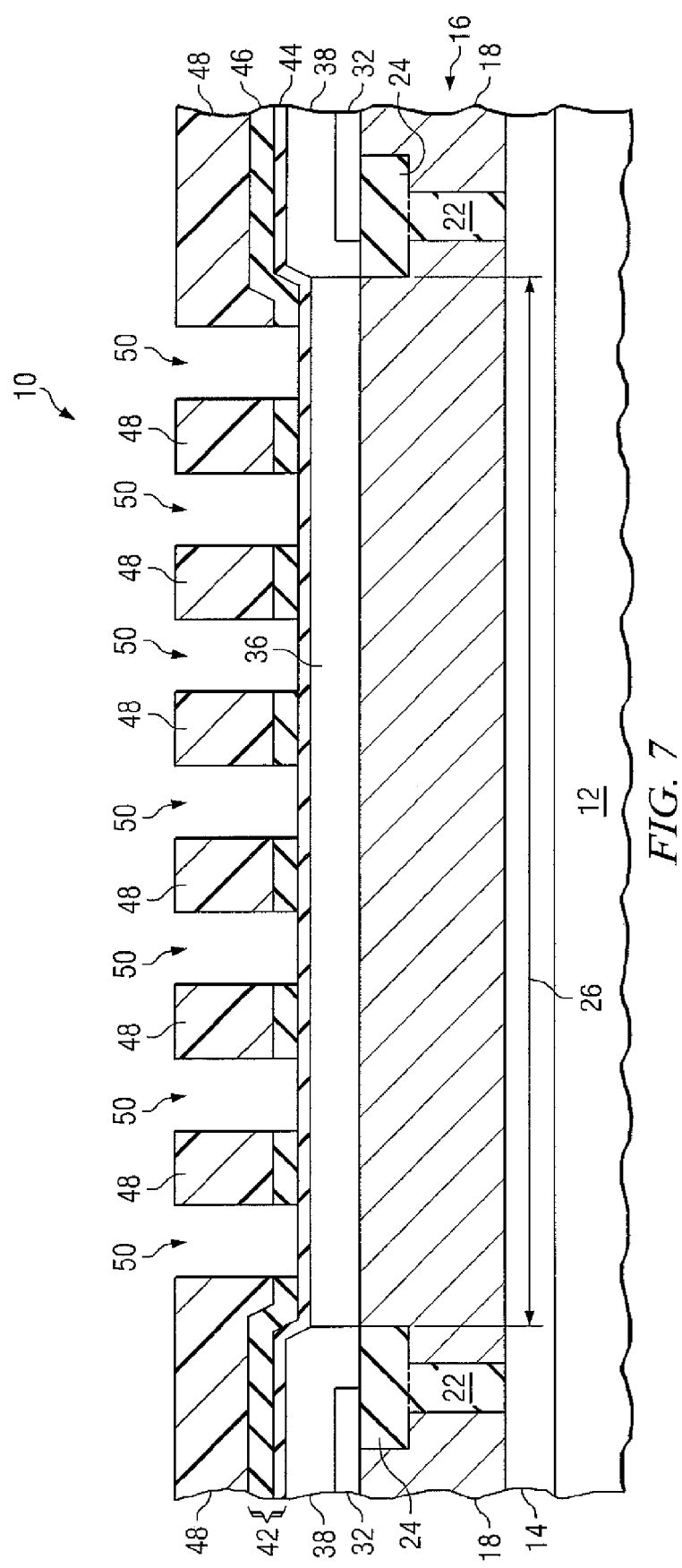
FIG. 7 is a schematic sectional view through an integrated semiconductor circuit, including a plurality of dummy window structures.

In FIG. 6, only one active emitter window 49 and one dummy emitter window 50 is drawn for the sake of a clear presentation. In practice, however, multiple active window structures 49 and dummy emitter window structures 50 are normally created, as it is shown by example in FIG. 7.

Figure 8:
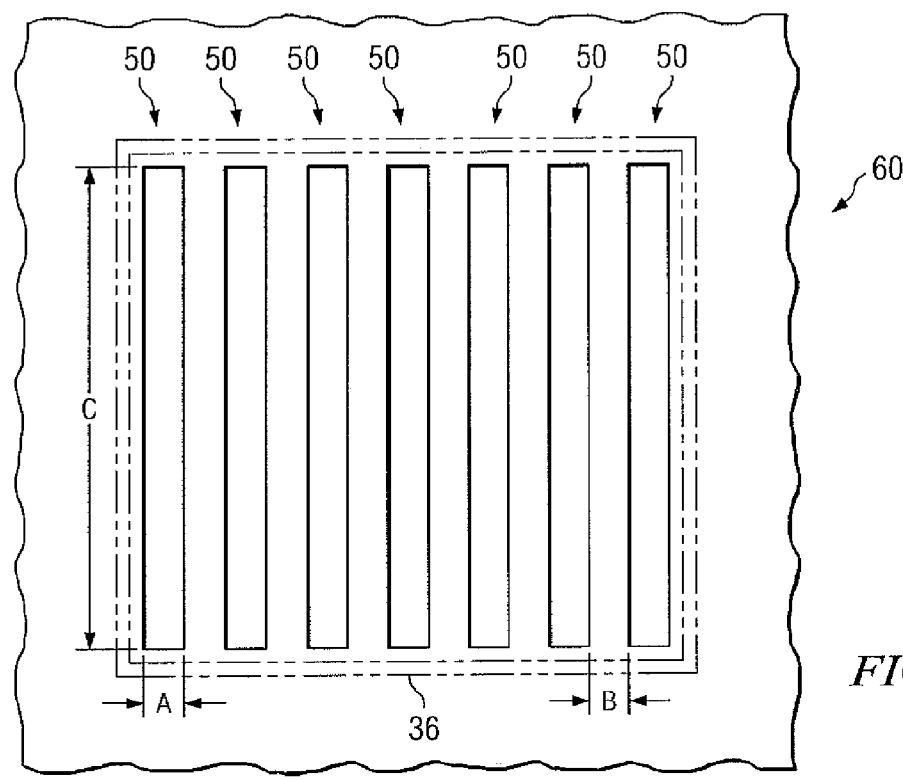
FIG. 8 shows the layout of the set of dummy window structures of FIG. 7.

FIG. 8 shows an example of a layout pattern 60 for a plurality of dummy emitter window structures 50. Also shown in FIG. 8 is the outline of the dummy moat area in inner dot-dashed lines. Further the outline of the base poly-silicon layer 36 is indicated in outer dot-dashed lines, since the dummy emitter window structures 50 are stacked over the dummy base window structures. So, the dummy window structures for endpoint detection during the etching of active base windows and during the etching of active emitter windows can be arranged within the same dummy moat areas.

The dimensions a and b are determined by the minimal width of the active window structures on the chip. The length c of the dummy window structures is adjustable and depends on the size of the dummy moat.

The dummy base and/or emitter window structures, e.g., the layout which is illustrated in FIG. 8, is preferably applied to as much dummy moat areas 26 as are available on the wafer. The proportion of the area occupied by the emitters on BiCMOS chips is far below 1%. The use of a significant number of dummy window structures can increase the proportion of the total surface available for etching to 3-5%. As a result, a signal from monitoring the etching process will have much more significant changes, when the small structures are completed, which allows a reliable detection of the optimum etch endpoint.

Figure 9A:
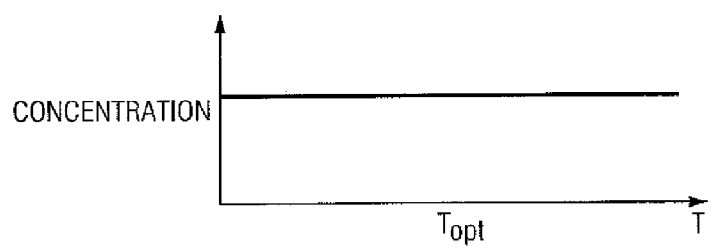
FIGS. 9A-9C are three graphs, illustrating signals resulting from monitoring the composition of the etching medium, on the basis of the characteristic plasma emission, recorded against time.
Figure 9B:
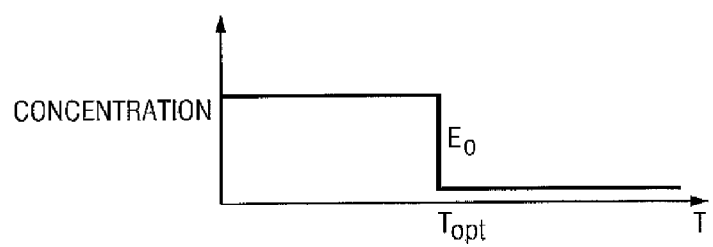
Figure 9C:
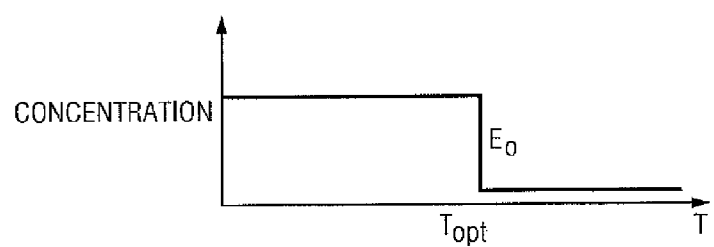

During an etching process according to the methods described above, the composition of the etching medium can be monitored by way of its characteristic plasma emission. FIGS. 9A-9C show schematically the composition of the etching medium monitored as a function of its characteristic plasma emission over time t for different configurations. The optimum end etchpoint for the small structures in the particular configuration is indicated in the Figures by $T_{opt}$.

If according to the prior art, no dummy windows have been applied there will be no endpoint signal (FIG. 9A) when the etching medium reaches the oxide layer. The change in the composition of the etching medium cannot be measured, because the proportion of the area occupied by the active window structures only amounts to some parts in thousand, as compared to the total area available.

If large dummy areas without window structures are provided in the wafer, as already proposed in the literature, monitoring the etchant composition will show a signal like the one in FIG. 9B. The endpoint signal $E_O$ here occurs too early and prior to the optimum moment in time for the termination of the etching process of the small window structures, since the etching of large areas proceeds in a different way from that of thin window structures.

FIG. 9C shows that by using dummy window structures according to the invention, the optimum moment in time at which the etching process should be terminated can be determined with precision by means of the endpoint signal $E_O$.

The invention claimed is:

1. An integrated BiCMOS semiconductor circuit, comprising: active moat areas in silicon, which active moat areas include electrically active components of the semiconductor circuit, the active components comprising active window structures for base and/or emitter windows; zones where silicon is left to form dummy moat areas which do not include electrically active components; and isolation trenches to separate the active moat areas from each other and from the dummy moat areas; wherein the dummy moat areas comprise dummy window structures having geometrical dimensions and shapes resembling those of the active window structures for the base and/or emitter windows.

2. An integrated BiCMOS semiconductor circuit according to claim 1, wherein the total surface area of the dummy window structures in the dummy moat areas exceeds the total surface area of the active window structures in the active moat areas by at least one order of magnitude of the total surface area of the active window structures in the active moat areas.

3. An integrated BiCMOS semiconductor circuit according to claim 2, wherein
   the active base window structures are formed in a first set of one or more layers over the active moat areas and the active emitter window structures are formed in a second set of one or more layers over the active moat areas;
   the dummy base window structures are formed in the first set of layers over the dummy moat areas and the dummy emitter window structures are formed in the second set of layers over the dummy moat areas; and
   the dummy emitter window structures are stacked over the dummy base window structures within the dummy moat areas.

4. An integrated BiCMOS semiconductor circuit according to claim 1, wherein
   the active base window structures are formed in a first set of one or more layers over the active moat areas and the active emitter window structures are formed in a second set of one or more layers over the active moat areas;
   the dummy base window structures are formed in the first set of layers over the dummy moat areas and the dummy emitter window structures are formed in the second set of layers over the dummy moat areas; and
   the dummy emitter window structures are stacked over the dummy base window structures within the dummy moat areas.

* * * * *